US012701719B2

(12) United States Patent
Chen et al.

(10) Patent No.: US 12,701,719 B2
(45) Date of Patent: Aug. 4, 2026

(54) MEMORY DEVICE STRUCTURE AND FABRICATION METHOD

(71) Applicant: Yangtze Memory Technologies Co., Ltd., Wuhan (CN)

(72) Inventors: Liang Chen, Wuhan (CN); Wei Liu, Wuhan (CN); Yongna Li, Wuhan (CN); Huaguo Sheng, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 680 days.

(21) Appl. No.: 18/089,926

(22) Filed: Dec. 28, 2022

(65) Prior Publication Data

US 2024/0196630 A1 Jun. 13, 2024

(30) Foreign Application Priority Data

Dec. 9, 2022 (CN) .......................... 202211588759.7

(51) Int. Cl.
*H10B 80/00* (2026.01)

(52) U.S. Cl.
CPC .................................... *H10B 80/00* (2023.02)

(58) Field of Classification Search
CPC ......... H10B 80/00; H10B 43/27; H10B 43/40
See application file for complete search history.

(56) References Cited

U.S. PATENT DOCUMENTS

2003/0141935 A1* 7/2003 Chen ................... H03F 3/45206
330/301
2020/0363989 A1* 11/2020 Li ........................... H01L 24/05

* cited by examiner

*Primary Examiner* — Timor Karimy
(74) *Attorney, Agent, or Firm* — Anova Law Group, PLLC

(57) ABSTRACT

A 3D memory device includes a complementary metal-oxide-semiconductor (CMOS) structure having a page buffer region and a string driver region respectively corresponding to a cell region and a string region in an array structure, wherein the CMOS structure further includes a plurality of page buffers in a folded structure formed in the page buffer region; and string driver circuits formed in the string region.

20 Claims, 13 Drawing Sheets

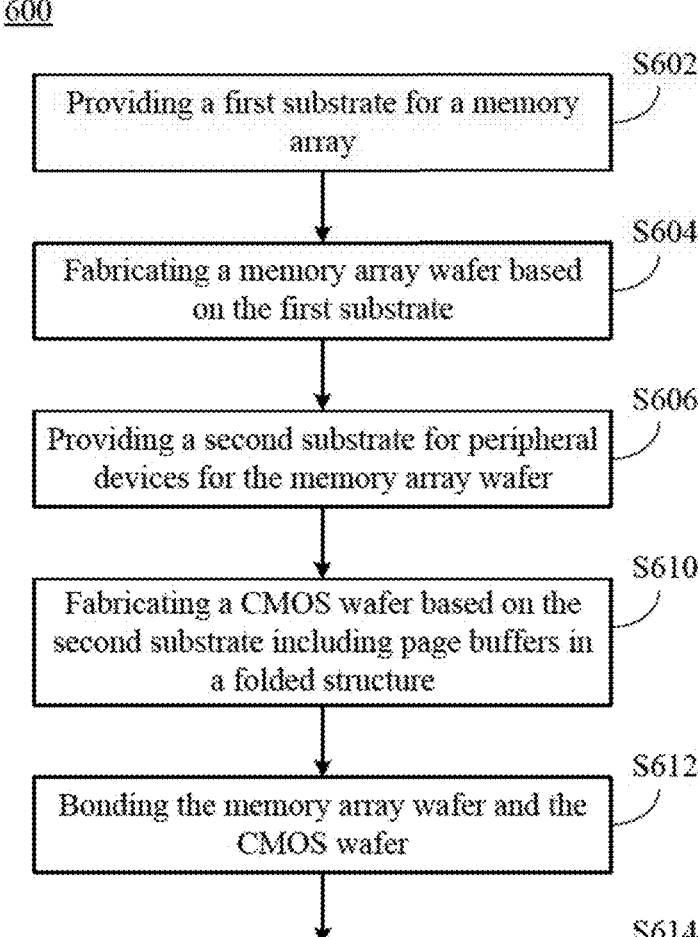

600

S602

Providing a first substrate for a memory array

S604

Fabricating a memory array wafer based on the first substrate

S606

Providing a second substrate for peripheral devices for the memory array wafer

S610

Fabricating a CMOS wafer based on the second substrate including page buffers in a folded structure

S612

Bonding the memory array wafer and the CMOS wafer

S614

Forming a 3D memory device of the memory array wafer and the CMOS wafer

MEMORY DEVICE STRUCTURE AND FABRICATION METHOD

CROSS-REFERENCE TO RELATED APPLICATION

This application claims the priority to Chinese Patent Application No. 202211588759.7, filed on Dec. 9, 2022, the content of which is incorporated herein by reference in its entirety.

FIELD OF THE DISCLOSURE

The present disclosure generally relates to the field of memory device and, more particularly, relates to a memory device structure and fabrication method thereof.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit. 3D memory architecture can address the density limitation in planar memory cells. 3D memory architecture includes a memory array and peripheral devices for controlling signals to and from the memory array.

For 3D NAND memory devices, the peripheral devices are often located in a complementary metal-oxide-semiconductor (CMOS) area. As the number of 3D NAND layers continues to increase, the memory array size under the same capacity continues to decrease, which also requires the CMOS area to continue to shrink. Such requirement is often challenging when designing and fabricating the 3D NAND memory devices. The disclosed devices and fabrication methods are directed to solve one or more problems set forth above and other problems in the art.

BRIEF SUMMARY OF THE DISCLOSURE

One aspect of the present disclosure provides a 3D memory device. The 3D memory device includes a complementary metal-oxide-semiconductor (CMOS) structure having a page buffer region and a string driver region respectively corresponding to a cell region and a string region in an array structure, wherein the CMOS structure further includes a plurality of page buffers in a folded structure formed in the page buffer region; and string driver circuits formed in the string region.

Another aspect of the present disclosure provides a memory system. The memory system includes a 3D memory device, a memory controller coupled to the 3D memory device for controlling the 3D memory device; and an external interface for communicating with a host for storing information in the 3D memory device. The 3D memory device includes a complementary metal-oxide-semiconductor (CMOS) structure having a page buffer region and a string driver region respectively corresponding to a cell region and a string region in an array structure, a plurality of page buffers in a folded structure formed in the page buffer region; and string driver circuits formed in the string region.

Another aspect of the present disclosure provides a method for forming a 3D memory device. The method includes forming an array wafer having a cell region and a string region, which includes providing a first substrate; forming a plurality of memory cells on the first substrate in the cell region; and forming a string structure on the first substrate in the string region. The method also includes forming a CMOS wafer having a page buffer region and a string driver region respectively corresponding to the cell region and the string region, which includes providing a second substrate; forming a plurality of page buffers in a folded structure in the page buffer region; and forming string driver circuits in the string region. The method further includes bonding the array wafer and the CMOS wafer at a bonding interface; and forming the 3D memory device based on the bonded array wafer and CMOS wafer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 6 illustrates an exemplary fabrication process of a 3D memory device consistent with various disclosed embodiments in the present disclosure;

DETAILED DESCRIPTION

Figure 1A:
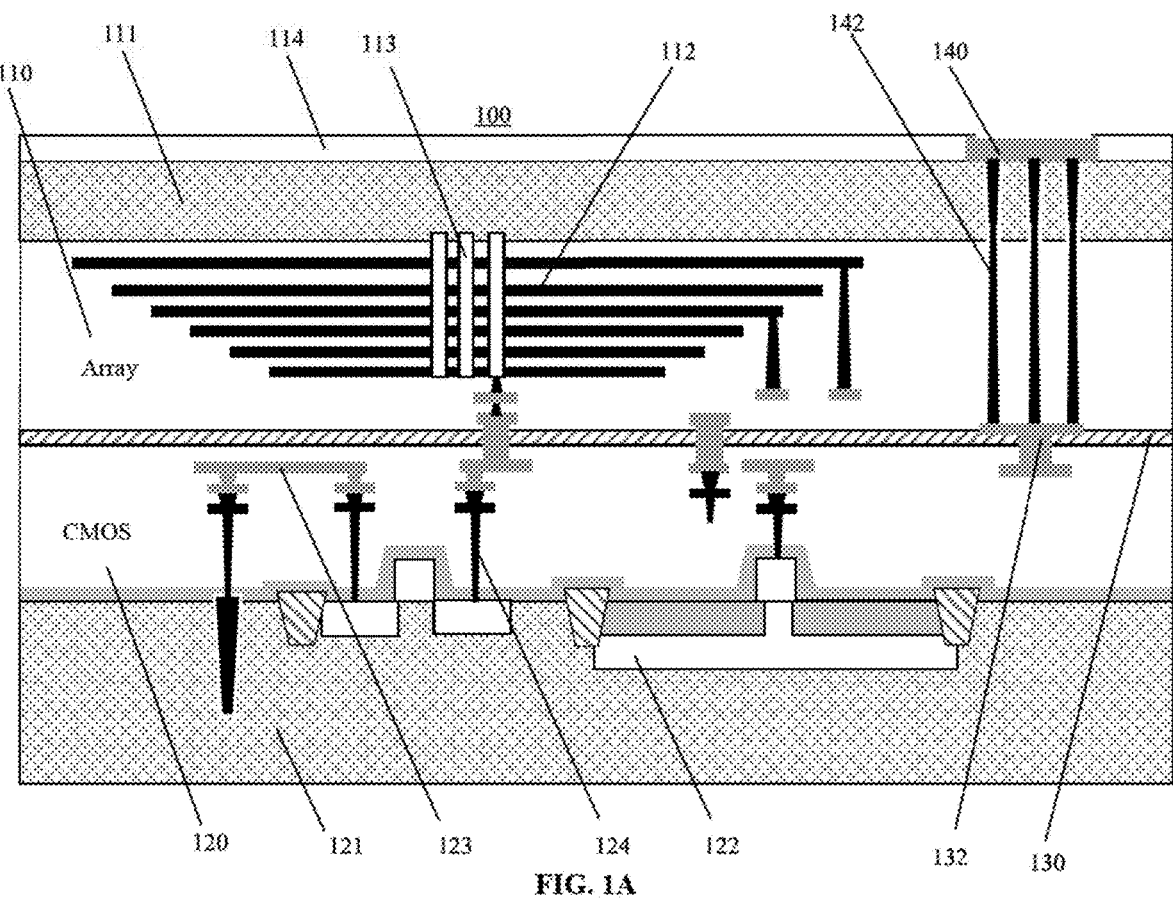
FIG. 1A illustrates an exemplary 3D memory device consistent with various disclosed embodiments in the present disclosure.

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It is noted that references in the specification to "one embodiment," "an embodiment," "an exemplary embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment.

Further, when a particular feature, structure or characteristic is described in contact with an embodiment, it would be within the knowledge of a person skilled in the pertinent art to affect such feature, structure or characteristic in contact with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The term "vertical" refers to the direction perpendicular to the surface of a semiconductor substrate, and the term "horizontal" refers to any direction that is parallel to the surface of that semiconductor substrate.

As used herein, the term "3D memory device" refers to a semiconductor device with vertically oriented strings of memory cell transistors (referred to herein as "memory strings", such as NAND strings) on a laterally-oriented substrate so that the memory strings extend in the vertical direction with respect to the substrate. In certain embodiments, the 3D memory device may also refer to a part of the semiconductor device, such as a wafer or a separate semiconductor structure in the semiconductor device.

FIG. 1A illustrates a 3D memory device 100 consistent with the disclosed embodiments of the present disclosure. In certain embodiments, the 3D memory device 100 be a 3D NAND memory device. 3D NAND is a flash memory technology which stacks memory cells vertically to increase capacity for higher storage density and lower cost per gigabyte.

As shown in FIG. 1A, the 3D memory device (i.e., a 3D NAND memory device) 100 may include a memory cell array wafer ("array wafer") 110 and a complementary metal-oxide-semiconductor wafer ("CMOS wafer") 120. The array wafer 110 may include the memory structures for the 3D memory device 100, and the CMOS wafer may include peripheral devices for the memory structures of the array wafer 110. The array wafer 110 and the CMOS wafer 120 are bonded together to form the framework of the 3D memory device 100. A bonding interface 130 may be provided to bond together the array wafer 110 and the CMOS wafer 120.

The array wafer 110 may include a substrate 111, a plurality of memory cells 112, and a string structure (SS) 113. Other structures and devices may also be included. The substrate 111 may be made of a material including silicon, germanium, SiGe, SiC, silicon on insulator (SOI), germanium on insulator (GOI), glass, III-V group compound (e.g., GaN, GaAs, InAs, etc.), or any other appropriate semiconductor material. In one embodiment, the substrate 111 is a silicon substrate.

In a 3D NAND memory device, the memory cells 112 may be formed as strings of memory cells, and the strings of memory cells 112 may form a plurality of memory blocks of the 3D NAND memory device. In certain embodiments, the plurality of memory blocks may be grouped into pages to form a 3D memory structure, and the page may be logically defined or physically defined. Further, semiconductor pillars may be formed in the channel holes (CH) that vertically penetrate through a conductor-dielectric pair stack. The stair structure SS may be provided at the two opposite ends of each memory block for the formation of contacts such as through array contacts (TACs).

That is, in the 3D memory device 100, memory cells 112 for storing data are stacked vertically to form a stacked memory structure. The string structure 113 may be formed at one or more sides of the stacked memory structure for certain purposes, such as word line fan-out. The stacked memory structure may include a plurality of semiconductor channels, and the semiconductor channel can be vertical to the major surface of the substrate 111. In certain embodiments, the memory cells 112 and the string structure 113 may be formed at certain regions on the substrate 111/array wafer 110. For example, the substrate 111 may include one or more cell regions for forming the memory cells, and one or more string regions for forming the string structure. The one or more cell regions and the one or more string regions may be arranged in a predetermined way to increase efficient and/or reliability of the fabrication process of the array wafer 110.

Figure 2A:
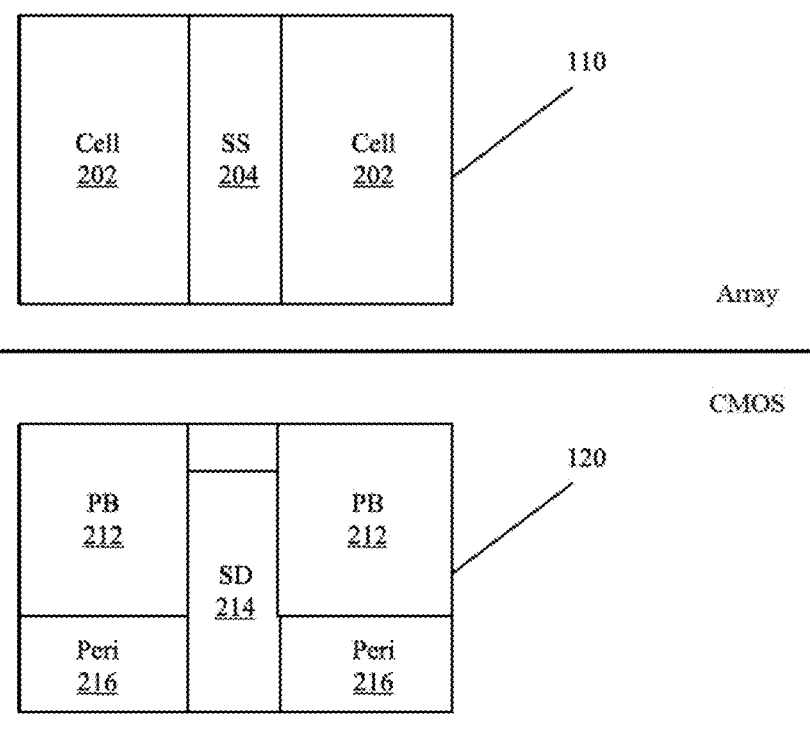
FIG. 2A illustrates an arrangement of one or more cell regions and one or more string regions consistent with various disclosed embodiments in the present disclosure.

FIG. 2A illustrates an arrangement of one or more cell regions and one or more string regions consistent with the disclosed embodiments. As shown in FIG. 2A, the array wafer 110 may include a string region SS 204 at the center of the array wafer 110, and two cell regions 202 at each side of the array wafer 110.

Figure 2B:
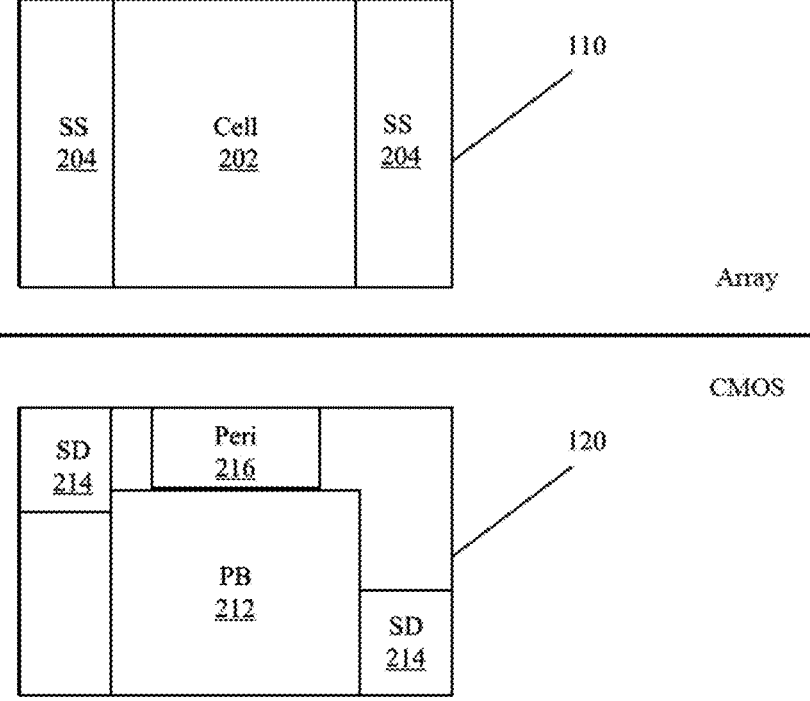
FIG. 2B illustrates another arrangement of one or more cell regions and one or more string regions consistent with various disclosed embodiments in the present disclosure.

FIG. 2B illustrates another arrangement of the one or more cell regions and the one or more string regions consistent with the disclosed embodiments. As shown in FIG. 2B, the array wafer 110 may include a cell region Cell 202 at the center of the array wafer 110, and two SS regions 204 at each side of the array wafer 110. Other layouts may also be used.

Further, returning to FIG. 1A, the array wafer 110 may include an insulating layer 114 formed on the back side of the substrate 111. The insulating layer 114 may have one or more openings for encapsulating and forming at least one array pad 140. The at least one array pad is in in contact with the least one through substrate contact (TSC) 142. The TSC 142 may be formed by conductor materials, such as W, Co, Cu, Al, polysilicon, silicides, or any combination thereof. In some embodiments, other conductor materials may be also used.

By using the at least one array pad 140 on the back side of the substrate 111, rather than the surrounding regions of the first substrate, other circuits including the periphery circuits of the 3D memory device 100 can be connected out through the back side of the 3D memory device 100. Thus, the size of the 3D memory device 100 can be reduced and the integration degree of the 3D memory device can be increased. Further, the risk of plasma-induced damage (PID) to the CMOS devices can also be eliminated.

Further, the CMOS wafer 120 may include a substrate 121, a plurality of CMOS devices 122, various interconnect structures 123, and a variety of through silicon via (TSV) 124. Other structures and devices may also be included. The substrate 121 may be made of a material including silicon, germanium, SiGe, SiC, silicon on insulator (SOI), germanium on insulator (GOI), glass, III-V group compound (e.g., GaN, GaAs, InAs, etc.), or any other appropriate semiconductor material. In one embodiment, the substrate 121 is a silicon substrate.

Figure 1B:
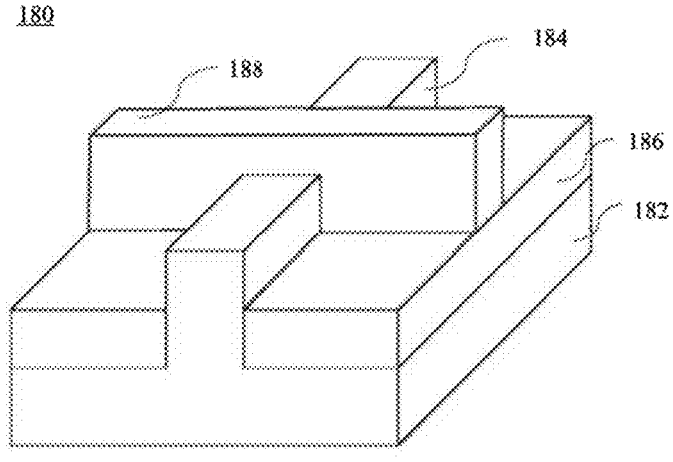
FIG. 1B illustrates an exemplary MOS device consistent with various disclosed embodiments in the present disclosure.

The CMOS devices 122 may refer generally to any appropriate peripheral devices for the array wafer 110 to support the memory arrays/cells and/or for the CMOS wafer 120, and the COMS devices 122 may also be referred to peripheral devices 122. For example, the peripheral devices 122 may include digital signal circuits, analog signal circuits, and/or mixed signal circuits, such as row decoders and column decoders, drivers, page buffers, sense amplifiers, timing and control, or the like. The peripheral devices 122 may be formed in a number of regions on the substrate 121 comprising active and/or passive semiconductor components, such as transistors, diodes, capacitors, resistors, etc. FIG. 1B illustrates an exemplary semiconductor structure 180 of CMOS devices 122 consistent with various disclosed embodiments in the present disclosure.

As shown in FIG. 1B, the semiconductor structure 180 may be a fin field-effect transistor (FinFET) having different fin heights. The semiconductor structure 180 may include a substrate 182, a fin 184, a shallow trench isolation (STI) structure 186, and a gate structure 188. The fin 184 may be connected between a source and a drain (not shown) of the semiconductor structure 180, and the fin 184 may include one or more fins. Other structures may also be included.

The substrate 182 may be part of the substrate 121 and may be a fin-shaped substrate including one or more original fins for fabricating the FinFET. Specifically, the fin 184 may be formed in the STI structure 186, and the gate structure 188 may be formed on the STI structure 186, and may cross and over the fin 184 to form the FinFET. A channel may be formed in the fin 184 between the source and drain, and the gate 188 may cover the channel in a three dimensional (3D) way. Thus, with the 3D structure between the gate 188 and the channel in the fin 184, for a CMOS device of the semiconductor structure 180, the device pitch of the CMOS device may be relatively small. However, the small device pitch of the CMOS devices 122 may make the wiring space of the CMOS devices 122 also relatively small.

Further, returning to FIG. 1A, the regions for the peripheral devices 122 for the CMOS wafer 120 may be determined according to the layout of the array wafer 110. That is, the peripheral devices 122 on the CMOS wafer 120 are formed corresponding to the memory structure of the array wafer 110, such that the peripheral devices 122 can support the function of the memory structure on the array wafer 110 (e.g., for power bus and metal routing). For example, the peripheral devices 122 may include page buffers to support memory cells in the array wafer 110, and string driver circuits to support the string structure in the array wafer 110. Further, certain peripheral devices may be formed in certain regions of the CMOS wafer 120/substrate 121. The regions of the CMOS wafer 120 may correspond to the regions of the array wafer 110.

For example, as shown in FIG. 2A, horizontally or laterally, the CMOS wafer 120 may include a string driver region SD 214 at the center of the CMOS wafer 120, corresponding to the region SS 204 of the array wafer 110, and two page buffer regions PB 212 at each side of the CMOS wafer 120, corresponding to the cell regions Cell 202 of the array wafer 110. In one embodiment, the string driver region SD 214 is under the region SS 204, and the page buffer region PB 212 may be under the cell region Cell 202. Further, the CMOS wafer 120 may also include two peripheral regions Peri 216 to form certain other peripheral devices on the CMOS wafer 120. Other regions may also be used.

For another example, as shown in FIG. 2B, horizontally or laterally, the CMOS wafer 120 may include a page buffer region PB 212 at the center of the CMOS wafer 120, corresponding to the region Cell 202 of the array wafer 110, and two string driver regions SD 214 at each side of the CMOS wafer 120, corresponding to the regions SS 204 of the array wafer 110. In one embodiment, the string driver region SD 214 is under the region SS 204, and the page buffer region PB 212 may be under the cell region Cell 202. Further, the CMOS wafer 120 may include a peripheral region Peri 216 to form certain other peripheral devices on the CMOS wafer 120. Other regions may also be used.

Further, returning to FIG. 1A, for the CMOS wafer 120, the interconnect structures 123 may be formed for providing vertical electrically interconnects between the array wafer 110 and the CMOS wafer 120, i.e., between memory structures of array wafer 110 and devices of the CMOS wafer 120, and/or among devices of the CMOS wafer 120. The through silicon via (TSV) 124 may be formed together with certain interconnect structures 123 to provide vertical connections.

The array wafer 110 and the CMOS wafer 120 may be bonded through the bonding interface 130. The bonding interface 130 may be a separate layer for bonding the array wafer 110 and the CMOS wafer 120, or may be a joint surface between the bonded array wafer 110 and CMOS wafer 120. For example, the bonding interface may include the interface between two dielectric layers (e.g., between a silicon nitride layer and a silicon oxide layer) and/or the interface between two conductive layers (e.g., between two metal layers). Further, one or more joint structures 132 may be formed at the bonding interface 130 to form electrical connections. For example, the joint structures 132 may be formed by corresponding one or more joint structures in the array wafer 110 and one or more joint structures in the CMOS wafer 120 being made contacted with each other at the bonding interface 130 for electrical connections.

The bonding interface 130 may be formed in any appropriate process. For example, the bonding interface 130 may be formed by chemical bonds between the dielectric layers and/or the conductive layers on both sides of the bonding interface. For another example, the bonding interface 130 can be formed by physical interaction (e.g., inter-diffusion) between the dielectric layers and/or the conductive layers on both sides of the bonding interface. In some embodiments, the bonding interface can be formed after a plasma treatment or a thermal treatment of the surfaces from both sides of the bonding interface prior to the bonding process.

Because the array wafer 110 and the CMOS wafer 120 are formed separately and then bonded together, damages from the various processes to form various layers and through silicon contacts (TSCs) may be performed on separate wafers without damaging each other's existing structures. Further, to bond the array wafer 110 and the CMOS wafer 120, corresponding devices in the array wafer 110 and the CMOS wafer 120 may need to be formed at precise locations. That is, the regions shown in FIGS. 2A and 2B on the array wafer 110 and the CMOS wafer 120 are corresponding to each other so that corresponding devices may be interconnected reliably.

Figure 3:
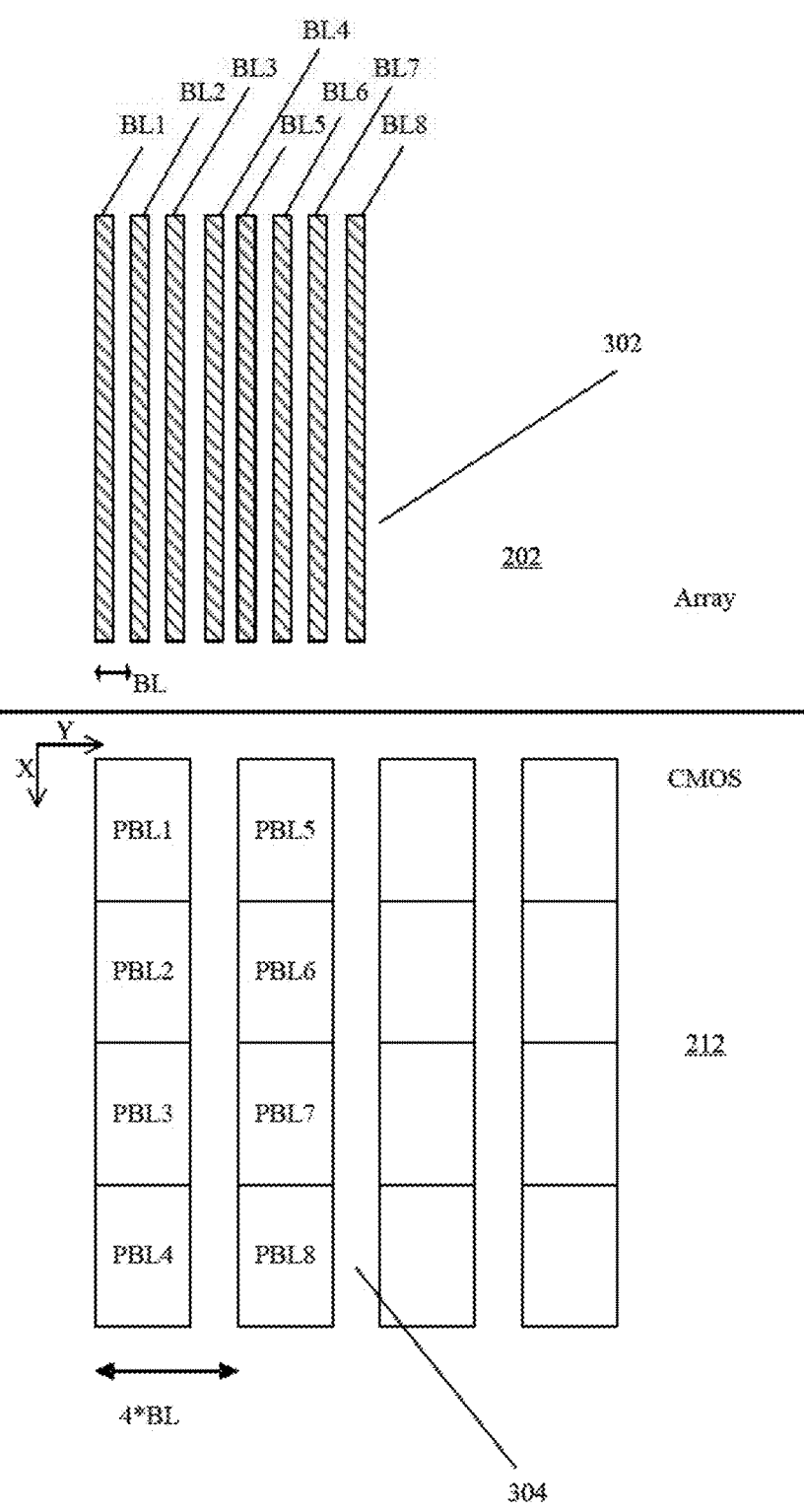
FIG. 3 illustrates a cross-sectional view of an arrangement of page buffers a CMOS wafer and bit line of an array wafer consistent with various disclosed embodiments in the present disclosure.

For the 3D memory device, data is stored in the memory cells 112, which are formed in the cell region(s) Cell 202 of the array wafer 110. The memory cells 112 may formed as a plurality of memory blocks, and the plurality of memory blocks grouped into pages. Further, bit lines are also formed to connect the memory cells in the pages. The bit lines may also be formed in the cell region. Correspondingly, page buffers are formed in the page buffer region(s) PB 212 corresponding to the pages of the plurality of memory blocks. Each page buffer may include circuits for supporting operations of the pages of the plurality of memory blocks. The circuits in the page buffers may be connected to the bit lines to form electrical connections. FIG. 3 shows a cross-sectional view of an arrangement of the page buffers and bit lines of the CMOS wafer 120 and the array wafer 110 consistent with the disclosed embodiments.

FIG. 3 only shows a part of the bit lines and page buffers for illustrative purposes. As shown in FIG. 3, a plurality of bit lines 302 may be arranged along the Y direction in the cell region of the array wafer 110, including a bit line BL1, a bit line BL2, a bit line BL3, a bit line BL4, a bit line BL5, a bit line BL6, a bit line BL7, and a bit line BL8. The bit lines may be aligned in the Y direction at a bit line period or bit line pitch BL. Correspondingly, a plurality of page buffers 304 may be arranged along the Y direction in the page buffer region of the CMOS wafer 120, a page buffer PBL1, a page buffer PBL2, a page buffer PBL3, a page buffer PBL4, a page buffer PBL5, a page buffer PBL6, a page buffer PBL7, and a page buffer PBL8. The page buffer PBL1 is connected to the bit line BL1, the page buffer PBL2 is connected to the bit line BL2, the page buffer PBL3 is connected to the bit line BL2, the page buffer PBL3 is connected to the bit line BL3, the page buffer PBL4 is connected to the bit line BL4, the page buffer PBL5 is connected to the bit line BL5, the page buffer PBL6 is connected to the bit line BL6, the page buffer PBL7 is connected to the bit line BL7, and the page buffer PBL8 is connected to the bit line BL8. Other bit lines and page buffers may also be arranged similarly.

In certain embodiments, the page buffers may be aligned in sequences of 4 page buffers in the X direction. In certain other embodiments, the page buffers may also be aligned in sequences of 8, 12, 16, 20, 24, or 32 page buffers in the X direction. Further, the sequences of page buffers may be arranged in the Y direction with a device pitch. The device pitch may be measured in a number of units of length or similar parameter. For example, the device pitch may be measure in term of number of bit lines, which corresponding to the number of bit line pitches in the Y direction. Specifically, as shown in FIG. 3, the sequence includes 4 pages buffers, and the device pitch for the page buffers may be 4 bit line pitches, i.e., the device pitch is 4*BL. That is, the device pitch is a pre-determined number multiplied by the bit line pitch, which correspond to the page buffers to be interconnected with the pre-determined number of bit lines, in this case the pre-determined number may be 4. Other device pitches corresponding different number of bit lines and/or page buffers in the sequence may also be used. Further, metal interconnects in the X direction (i.e., wiring channels) for each page buffer are also limited to the device pitch of 4*BL in the Y direction.

A buffer page may be coupled to a bit line to perform certain operation on the memory element on the bit line. For example, the page buffer may be coupled to the bit line and a terminal of the voltage bias transistor. The page buffer may charge the bit line to a predetermined voltage according to a bit line bias voltage during a pre-charge operation, and may form a sensing path from the bit line to a sensing amplifier during a sense operation. Thus, the page buffer may include a plurality of devices to facilitate these operations, such as transistors, capacitors, and/or resisters, and metal connections among these devices, etc.

Figure 4A:
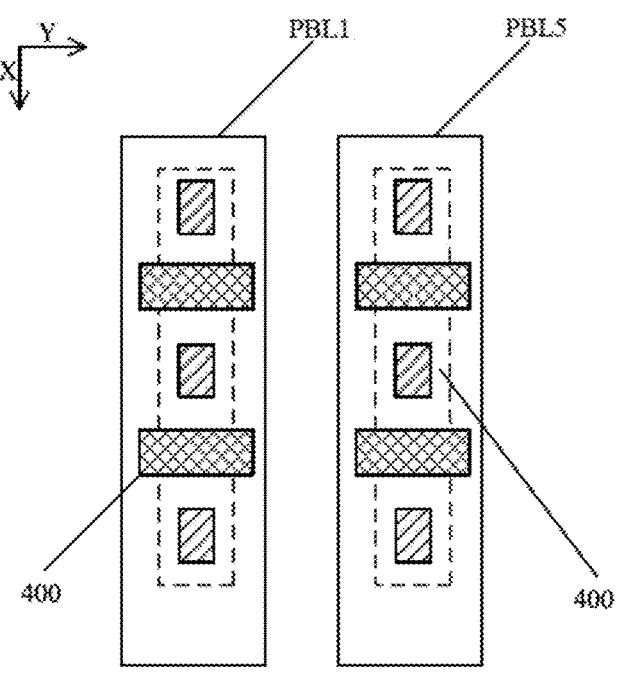
FIG. 4A illustrates an arrangement of devices in a page buffer consistent with various disclosed embodiments in the present disclosure.

The devices of the page buffer may be limited by the device pitch. That is, the various devices formed in the page buffer are limited by the device pitch in the Y direction. FIG. 4A shows an arrangement of devices in the page buffer consistent with the disclosed embodiments. As shown in FIG. 4A, each of device 400 of the page buffer PBL1 is formed within the device pitch, which is 4*BL, and each of device of the page buffer PBL5 (i.e., the neighboring page buffer in the Y direction) is also formed within the device pitch of 4*BL.

In addition to the plurality of devices, each page buffer may also include interconnects for electrical connections among devices as well as between the devices and the bit line, and the interconnects may form wiring channels for the page buffer. As the wiring channels are limited within the device pitch of the page buffers, the device pitch of 4*BL is also applied to the wiring channels of the page buffer.

Figure 4B:
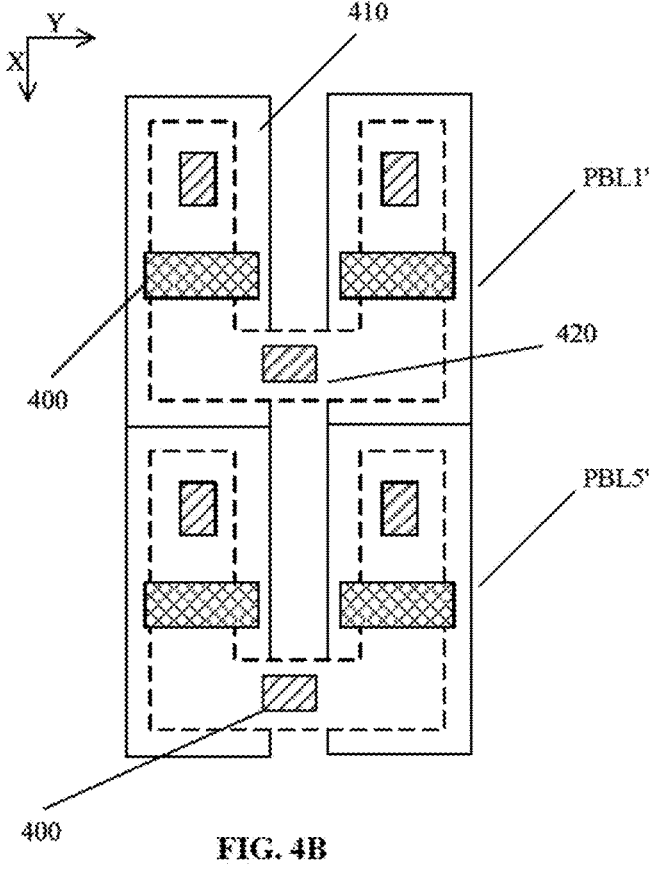
FIG. 4B illustrates another arrangement of devices in a page buffer consistent with various disclosed embodiments in the present disclosure.

Under certain circumstances, for example, when the width of the bit lines of the array wafer decreases (for example for higher capacity 3D memory devices), the device pitch may also be reduced for the page buffers of the CMOS wafer. A small device pitch may affect not only the size of the devices in the page buffer, but also the size of the interconnects for connecting and routing the devices and/or bit line. That is, not only the size of the devices in the CMOS wafer is further reduced, but also the size of the wiring channels for each page buffer is also further reduced. Accordingly, in some embodiments, when the wiring channels may need a larger device pitch, a folded structure may be used to form the page buffers. That is, a structure of a folding page buffer in the Y direction may be used to increase the device pitch for the page buffers on the CMOS wafer 110, without changing the bit line arrangement on the array wafer 110. FIG. 4B shows another arrangement of devices in the page buffer consistent with the disclosed embodiments.

As shown in FIG. 4B, the page buffer PBL1' (corresponding to the page buffer PBL1 in FIG. 4A) is now extending in the Y direction to the position of the previous neighboring page buffer (the page buffer PBL5 in FIG. 4A), which doubles the device pitch of the page buffer, but is of approximately half of the length in the X direction. That is, the previous page buffer PBL1 is folded in the Y direction to create the new page buffer PBL1' having twice of the width of the previous page buffer PBL1. In the folded structure, the page buffer may include two unfolded portions 410, and a folding portion (or connecting portion) 420.

The number of devices or structures shown in the unfolding portions 410 and the folding portion 420 are for illustrative purposes only, any number of devices may be included in the unfolding portions 410 and/or the folding portion 420. As shown in FIG. 4B, the folding portion 420 may contain one or more devices or structures, such as a shared source or shared drain, and the unfolding portion 410 may include a plurality of devices or structures, such as sources, drains, and gates of CMOS devises (e.g., FinFETs), etc. The unfolded portions of the folded page buffer PBL1' (the portions in the X direction) may remain the same dimension as the original page buffer PBL1. The folding or connecting portion of the folded page buffer (the connection in the Y direction) may be of the same dimension as the unfolded portion of the folded page buffer (the portions in the X direction) or, alternatively, the connection portion of the folded page buffer may just include metal connections with a significantly smaller dimension than the main portion of the folded page buffer.

Figure 5A:
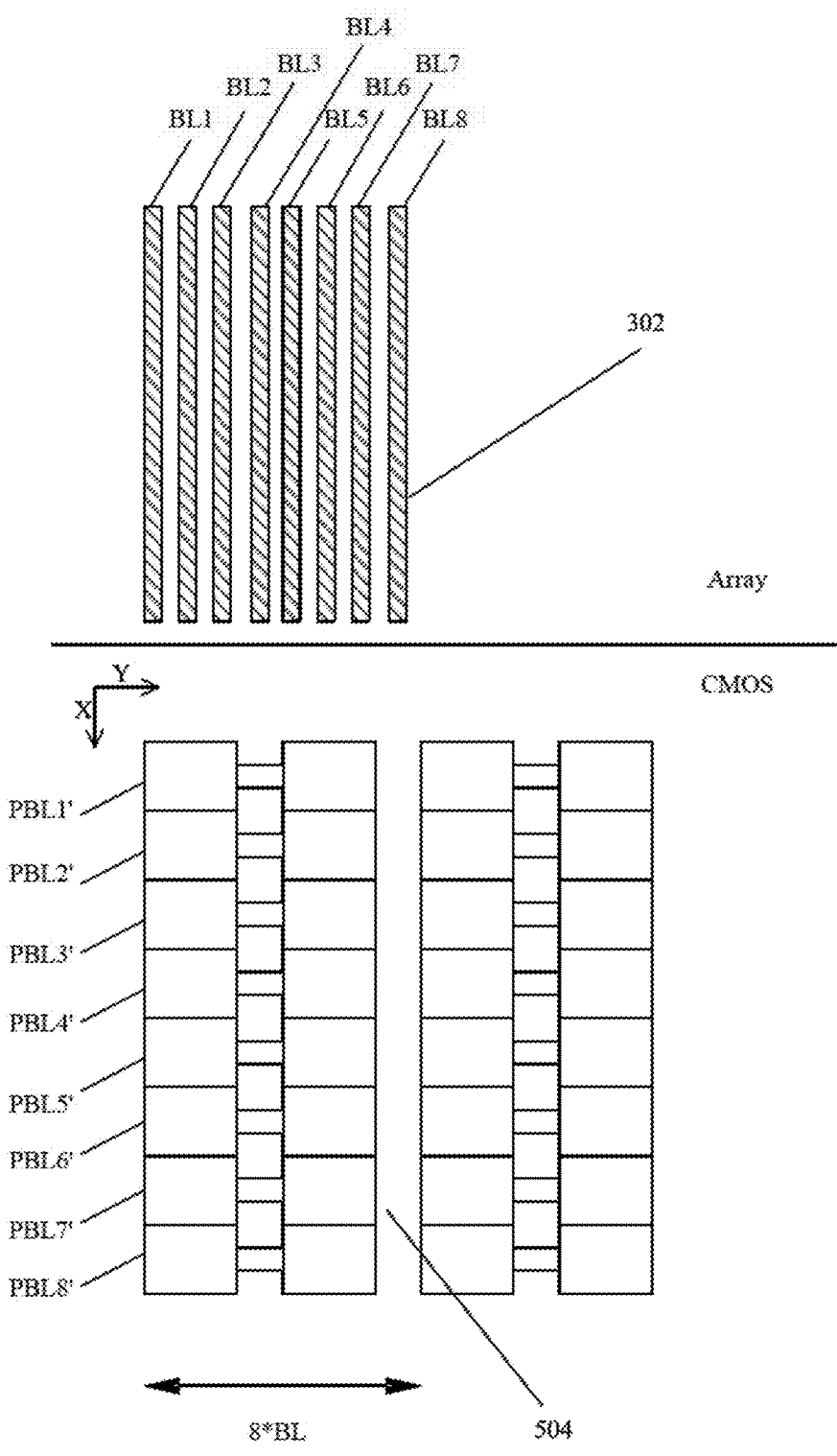
FIG. 5A illustrates a cross-sectional view of another arrangement of page buffers a CMOS wafer and bit line of an array wafer consistent with various disclosed embodiments in the present disclosure.

Similarly, the folded page buffer PBL2' has twice of the width of the previous page buffer PBL2 in the Y direction, but approximately half of the length in the X direction, doubling the device pitch of the page buffer. FIG. 5A shows a cross-sectional view of an arrangement of the folded page buffers and bit lines of the CMOS wafer 120 and the array wafer 110 consistent with the disclosed embodiments.

FIG. 5 only shows a part of the bit lines and folded page buffers for illustrative purposes. As shown in FIG. 5A and also referring to FIG. 3, a plurality of bit lines 302 may be arranged along the Y direction in the cell region of the array wafer 110, including a bit line BL1, a bit line BL2, a bit line BL3, a bit line BL4, a bit line BL5, a bit line BL6, a bit line BL7, and a bit line BL8. Correspondingly, a plurality of page buffers 504 may be arranged along the Y direction in the page buffer region of the CMOS wafer 120, a page buffer PBL1', a page buffer PBL2', a page buffer PBL3', a page buffer PBL4', a page buffer PBL5', a page buffer PBL6', a page buffer PBL7', and a page buffer PBL8'. All the page buffers PBL1' to PBL8' are the folded page buffers of the original page buffers PBL1 to PBL8. Further, the page buffer PBL1' is connected to the bit line BL1, the page buffer PBL2' is connected to the bit line BL2, the page buffer PBL3' is connected to the bit line BL3, the page buffer PBL4' is connected to the bit line BL4, the page buffer PBL5' is connected to the bit line BL5, the page buffer PBL6' is connected to the bit line BL6, the page buffer PBL7' is connected to the bit line BL7, and the page buffer PBL8' is connected to the bit line BL8. Accordingly, the device pitch for the folded page buffers is now 8*BL, that is, the new device pitch is doubling the previous device pitch of 4*BL in FIG. 3. That is, although the array wafer 110 is originally arranged for 4*BL device pitch of the page buffers, the CMOS wafer 120 can realize 8*BL device pitch of the page buffers. The numbers 4 and 8 are used for illustrative purposes, other numbers can also be used, as long as the new device pitch is larger than the previous or original device pitch.

However, in certain embodiments, the devices in the page buffers of the CMOS wafer 120 may still be limited by the dimension according to the device pitch of 4*BL, i.e., the device pitch for the devices in the page buffers remain at 4*BL. That is, the unfolded portions of the page buffers may remain the same as the previous page buffers, and the device pitch for the unfolded portions of the page buffers may still remain at the original device pitch of 4*BL. Thus, the devices (all or mostly in the unfolded portions of the page buffer) are still aligned at the original device pitch of 4*BL. On the other hand, the wiring channels for the page buffers may now be increased to 8*BL, doubling the size of the previous page buffers. In other words, the device pitch for the wiring channel of the page buffer is larger than the device pitch of the devices of the page buffer, when unfolding portions remain at the same dimension. Accordingly, the processes of forming the wiring channels of the folded page buffers may be less complex to implement, increasing the reliability of the memory device and saving fabrication cost.

Figure 5B:
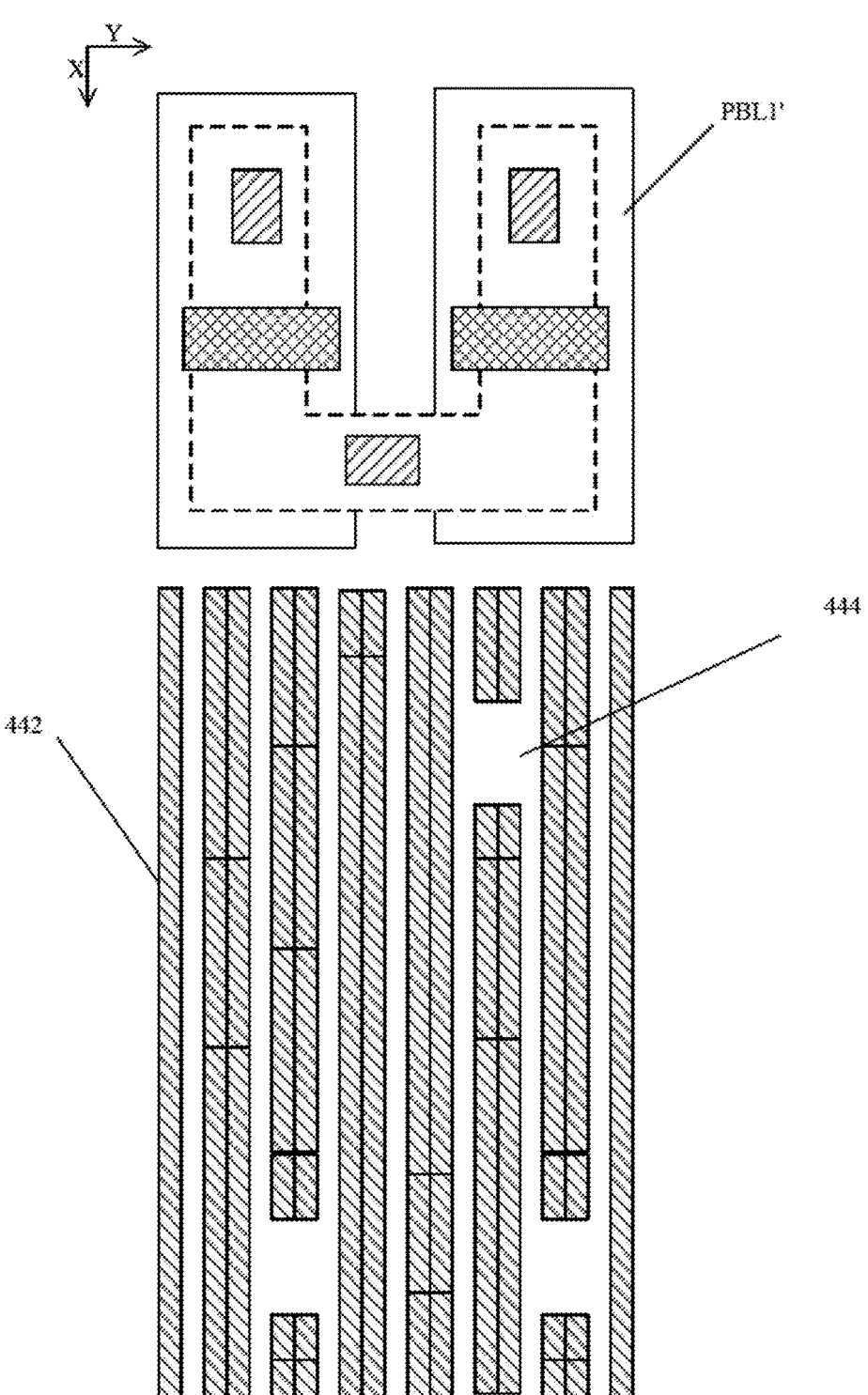
FIG. 5B illustrates a top view of an interconnect structure of page buffer devices consistent with various disclosed embodiments in the present disclosure.

In addition, the increased wiring channel device pitch may enable certain interconnect structures for the page buffer devices. FIG. 5B illustrates a top view of an interconnect structure of a page buffer device consistent with the disclosed embodiments. As shown in FIG. 5B, for the page buffer PBL1', with the increased device pitch, a single interconnect layer 442 may be used to interconnect the devices of the page buffer PBL1'. Alternatively, when the interconnect structure includes one or more line cuts 444, more than one interconnect layers may be used, and the wire width of the interconnects may be increased, such that the line cuts 444 may be relatively easily made, e.g., without a Self-aligned double patterning (SADP) plus a single cut process. The fabrication cost may be further reduced.

Figure 4C:
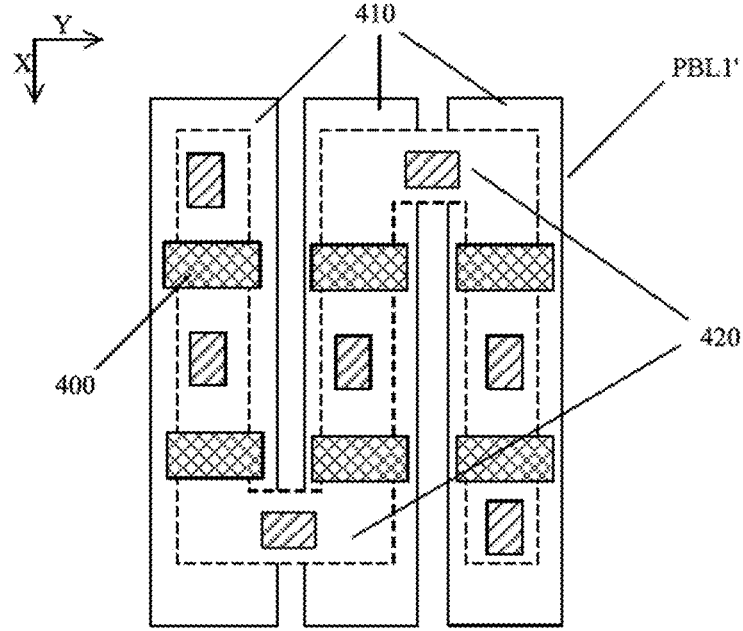
FIG. 4C illustrates another arrangement of devices in a page buffer consistent with various disclosed embodiments in the present disclosure.

Further, although the folded structure previously shown includes a single folding portion, i.e., folding once, the folded structure may include more than one folding. For example, the folded structure may include two folding portions (i.e., folding twice), three folding portions (i.e., folding three times), and so on. FIG. 4C illustrates another arrangement of devices in a page buffer with more than one folding portion consistent with various disclosed embodiments in the present disclosure.

As shown FIG. 4C, the page buffer PBL1' (corresponding to the page buffer PBL1 in FIG. 4A) is now extending in the Y direction to have a three times of the original device pitch of the page buffer. That is, the original page buffer PBL1 is folded twice in the Y direction to create the new page buffer PBL1' having three times of the width of the original page buffer PBL1. In the folded structure, the page buffer PBL1' may include three unfolded portions 410, and two folding portions (or connecting portions) 420. A number of devices 400 may be included.

Figures 4D, 4E:
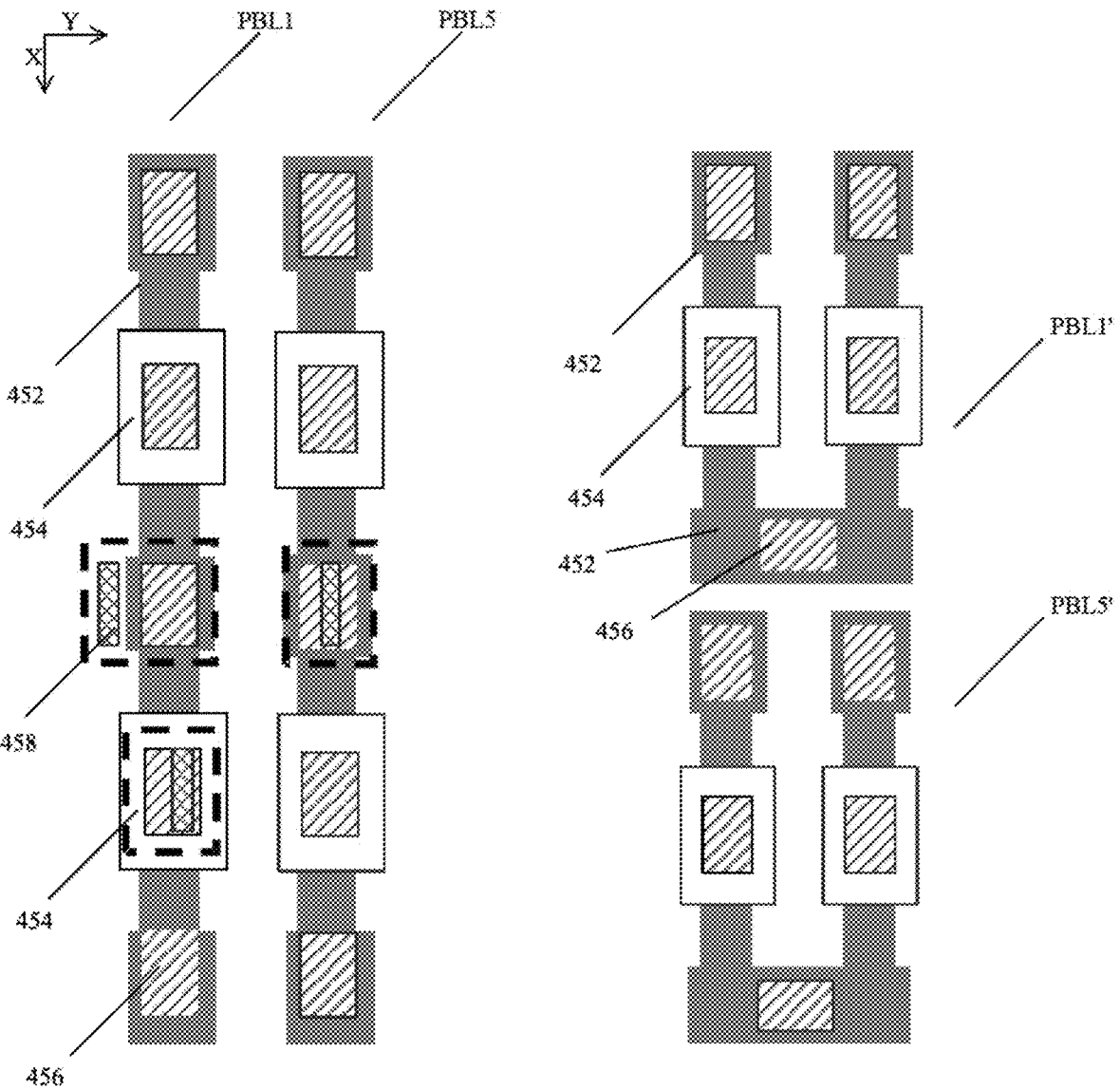
FIG. 4D illustrates another arrangement of devices in a page buffer consistent with various disclosed embodiments in the present disclosure.
FIG. 4E illustrates another arrangement of devices in a page buffer consistent with various disclosed embodiments in the present disclosure.

FIG. 4D shows an exemplary arrangement of devices in an unfolded configuration consistent with the disclosed embodiments, and FIG. 4E shows a corresponding arrangement of devices in a folded structure consistent with the disclosed embodiments. As shown in FIG. 4D, two FinFETs are included with a shared source/drain. More specifically, each of two gates 454 is disposed between a source 452 and a drain 452, and the middle source/drain 452 is a shared source/drain for the two gates 454. Further, contact 456 may be formed for each of gate/source/drain, and contact 458 may also be included for the shared source/drain, which may be restrained by the original device pitch. As shown in FIG. 4E, in the folded structure, the shared source/drain 452 is in the folding portion of the folded structure.

FIG. 6 shows a fabrication process 600 of the 3D memory device 100 consistent with the disclosed embodiments, and FIGS. 6A-6F show various fabrication stages of the fabrication process 600 consistent with the disclose embodiments. As shown in FIG. 6, at S602, also referring to FIG. 6A, a first substrate 111 is provided for fabricating a 3D array device. The first substrate may be made of a material including silicon, germanium, SiGe, SiC, silicon on insulator (SOI), germanium on insulator (GOI), glass, III-V group compound (e.g., GaN, GaAs, InAs, etc.), or any other appropriate semiconductor material. For example, the first substrate includes a semiconductor substrate, such as a single crystalline silicon substrate. The first substrate may also be a single layer substrate or a multi-layer substrate, for example, a monocrystalline single-layer substrate, a polycrystalline silicon (polysilicon) single-layer substrate, a polysilicon and metal multi-layer substrate, etc.

Figure 6A:
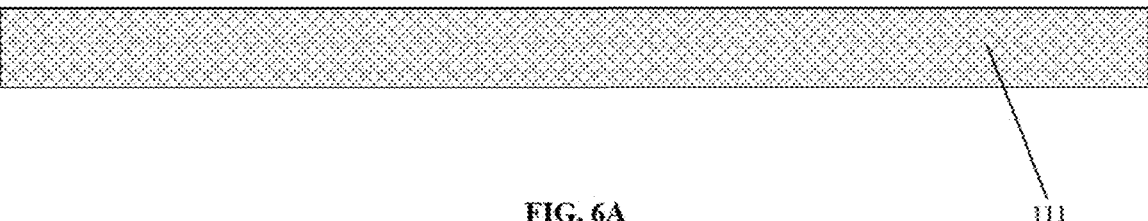
FIGS. 6A-6F show various fabrication stages of a fabrication process consistent with various disclosed embodiments in the present disclosure.
Figure 6B:
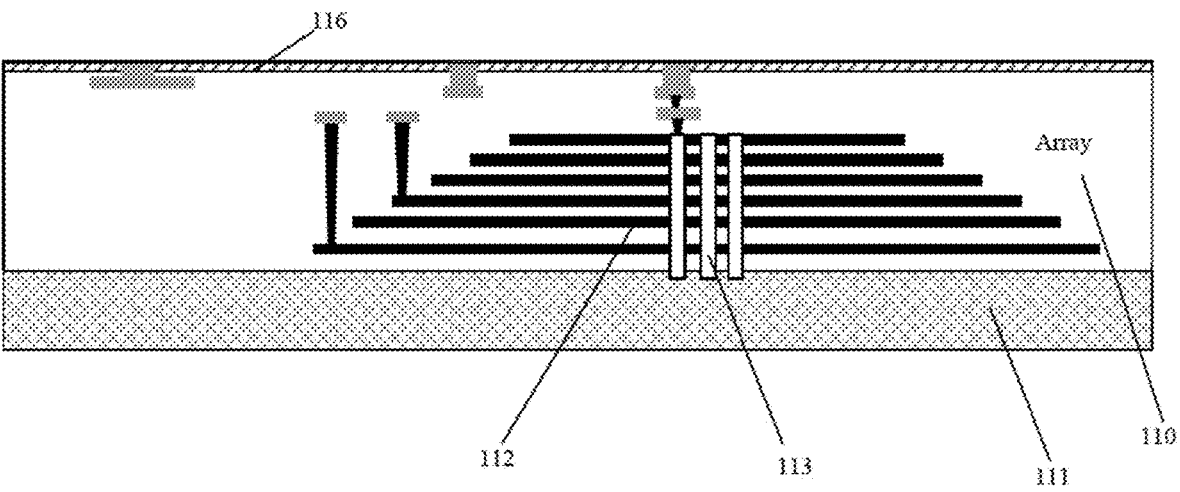

Further, at S604, also referring to FIG. 6B, a memory array wafer 110 is fabricated based on the first substrate 111 to form the memory array 112 and corresponding structures of the 3D memory device. For example, the first substrate 111 may include a string region and a cell region, and a string structure 113 may be formed in the string region and memory cells may be formed in the cell region in the form of an array of NAND strings extending vertically above the first substrate. Further, interconnects, such as interconnect contacts and vertical through contracts, may be formed for the vertical direction, and word lines and bit lines may also be formed to connect the string structure and the memory cells. The bit lines may be formed in the cell region on the memory array wafer may be connected to the memory cells and may have a pitch BL (i.e., bit line pitch or period in the Y direction).

In one embodiment, an array joint layer 116 may also be formed to include joint structures for later bonding with the CMOS wafer. The array joint layer 116 may be an interconnection layer including one or more joint structures embedded in a dielectric layer. The joint structures may include contacts, single-layer/multi-layer vias, conductive lines, plugs, pads, and/or any other suitable conductive structures that are made by conductive materials including W, Co, Cu, Al, doped silicon, silicides, or any combination thereof. The dielectric layer may include dielectric materials including silicon oxide, silicon nitride, silicon oxynitride, or any combination thereof. The joint structures may be exposed on the top surface of the array joint layer on the array wafer. Other processes and devices may also be performed or formed.

Figure 6C:
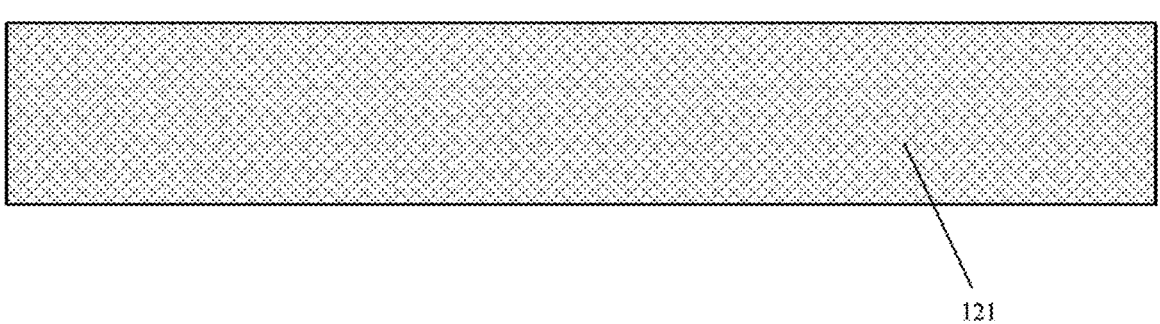

Further, at S606, also referring to FIG. 6C, a second substrate 121 is provided for forming peripheral devices for the memory array wafer. The second substrate 121 may include any suitable semiconductor material that can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. The second substrate 121 may be a single layer substrate or a multi-layer substrate, for example, a monocrystalline single-layer substrate, a polycrystalline silicon (polysilicon) single-layer substrate, a polysilicon and metal multi-layer substrate, etc. Other materials may also be used.

Figure 6D:
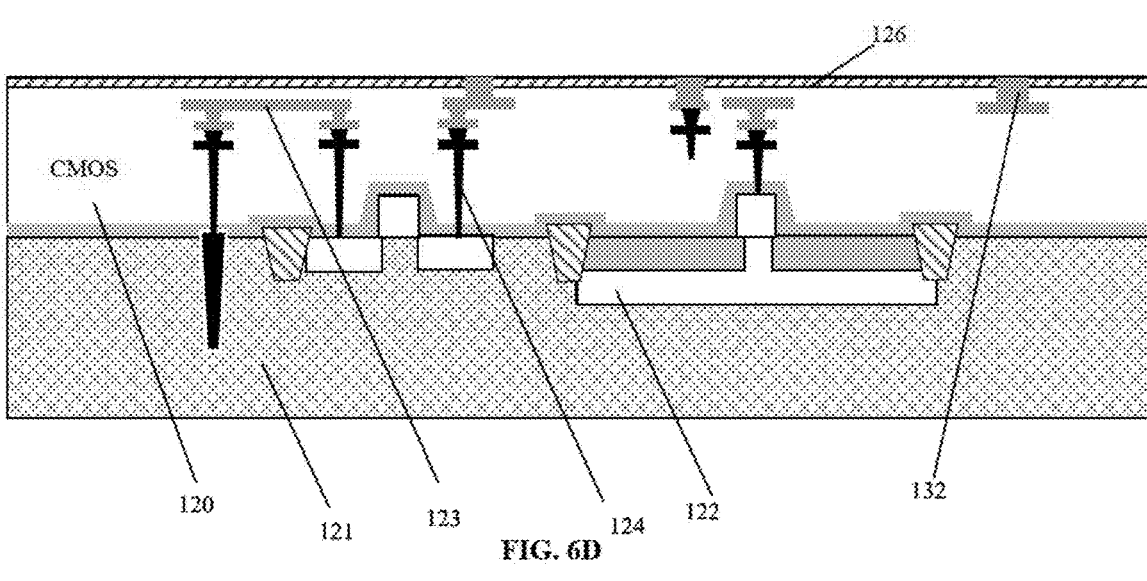

Further, at S608, also referring to FIG. 6D, a CMOS wafer 120 is fabricated based on the second substrate 121 including page buffers in a folded structure. For example, a peripheral circuit layer may be formed on the second substrate, including plurality of peripheral circuits. The peripheral circuits including any suitable digital, analog, and/or mixed-signal peripheral circuits used for facilitating the operation of the 3D memory device. In certain embodiments, the peripheral circuits may include one or more of a page buffer, a decoder (e.g., a row decoder and a column decoder), a latch, a sense amplifier, a driver, a charge pump, a current or voltage reference, or any active or passive components of the circuits (e.g., transistors, diodes, resistors, or capacitors). In some embodiments, the peripheral circuits include multiple CMOS devices formed using complementary metal-oxide-semiconductor (CMOS) technology. More specifically, the second substrate may include a page buffer region and a string driver region, and a plurality of page buffers may be formed in the page buffer region and string driver circuits may be formed in the string driver region.

The page buffer region corresponds to the cell region of the array wafer, and the string driver region corresponds to the string region of the array wafer. The page buffers are formed at a device pitch in the Y direction. Each page buffer includes a number of CMOS devices to implement functions of the page buffer, as well as a wiring channel for interconnects. Further, the page buffers may be formed in a folded structure to increase the original device pitch to a new device pitch significantly larger than the original device pitch (e.g., doubling the original device pitch). Under the folded page buffer structure, the wiring channel of the page buffer is at the new device pitch, while the devices of the page buffer may be limited to the original device pitch.

Further, a CMOS joint layer 126 may also be formed. The CMOS joint layer may be an interconnection layer including one or more joint structures embedded in a dielectric layer. The joint structures 132 may include contacts, single-layer/multi-layer vias, conductive lines, plugs, pads, and/or any other suitable conductive structures that are made by conductive materials including W, Co, Cu, Al, doped silicon, silicides, or any combination thereof. The dielectric layer may include dielectric materials including silicon oxide, silicon nitride, silicon oxynitride, or any combination thereof. One or more portions of the joint structures may be exposed on the top surface of the CMOS joint layer on the CMOS wafer.

Figure 6E:
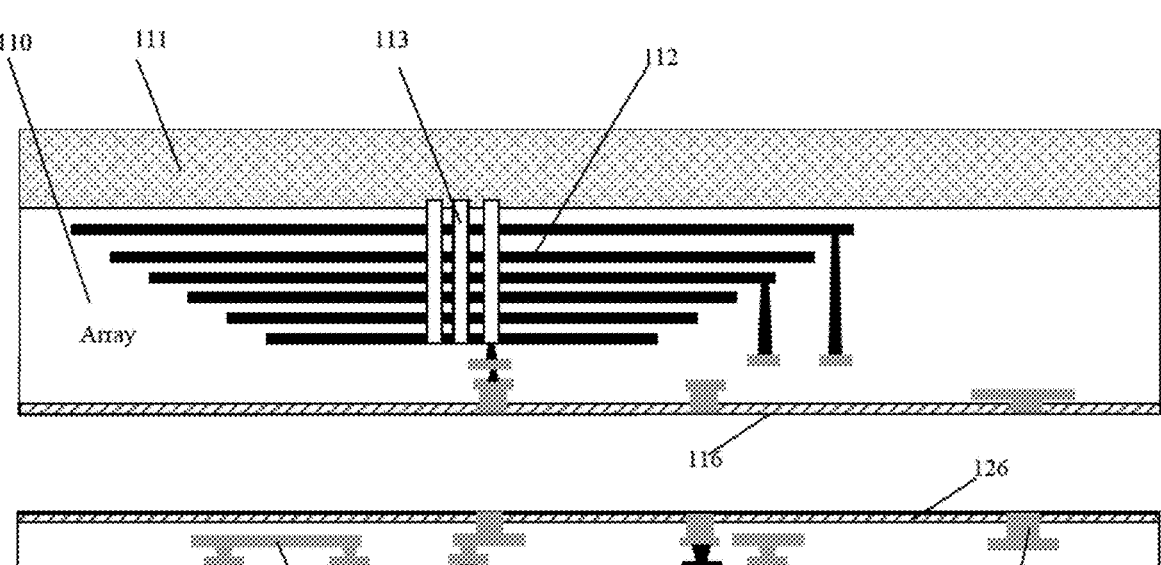
Figure 6E:
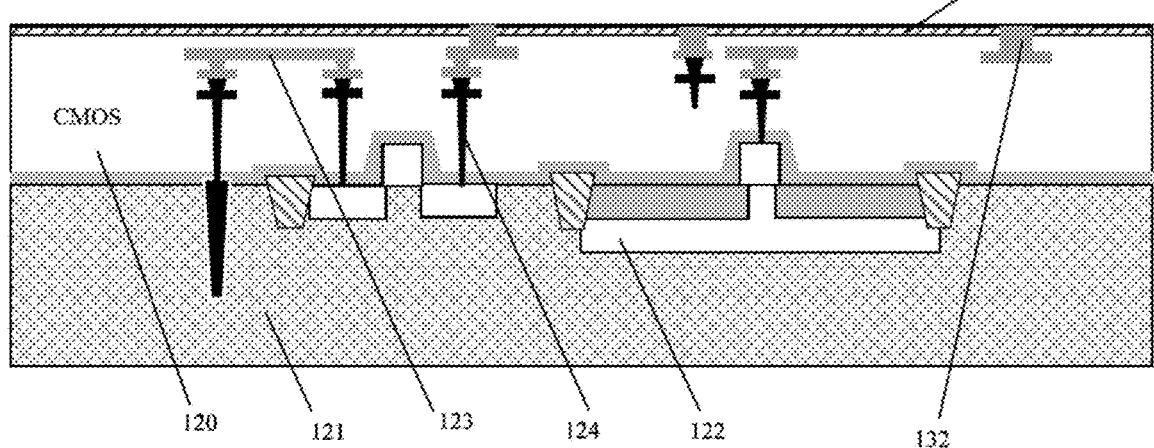

Further, at S610, also referring to FIG. 6E, the memory array wafer 110 and the CMOS wafer 120 are bonded together to form a 3D memory device 100. For example, the array wafer 110 may be flipped over to face down towards the CMOS wafer 120 for bonding the array joint layer 116 of the array wafer 110 to the CMOS joint layer 126 of the CMOS wafer 120. The bonding interface is between the array joint layer and the CMOS joint layer. Therefore, the bonding interface includes both the interface between two dielectric layers (e.g., between a silicon nitride layer and a silicon oxide layer) and the interface between two conductive layers (e.g., between metal contacts). In some embodiments, one or more joint structures in the array wafer and one or more joint structures in the CMOS wafer 400 can be contacted with each other at bonding interface for electrical connection.

Figure 6F:
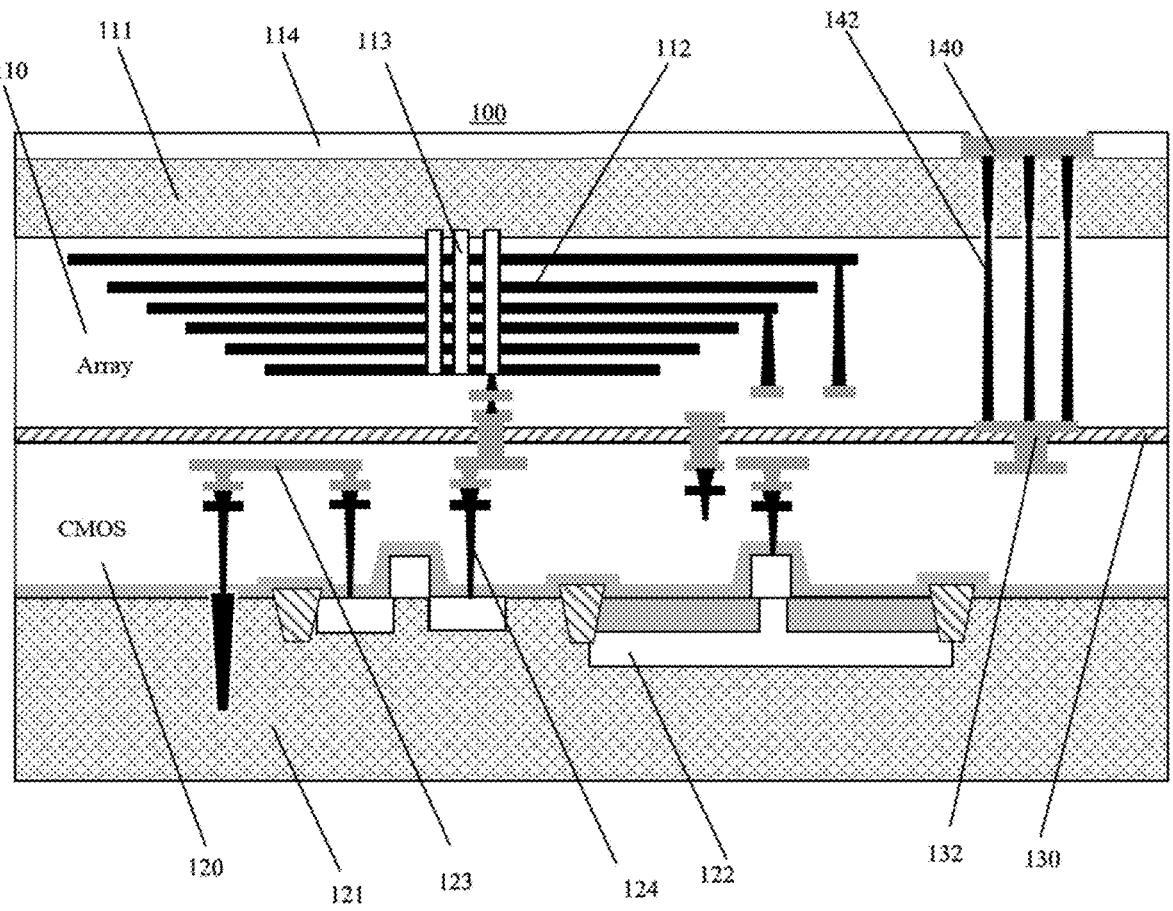

Further, at S612, also referring to FIG. 6F, a 3D memory device 100 is formed from the bonded memory array wafer 110 and CMOS wafer 120. For example, the first substrate 111 may be thinned by one or more suitable processes, and at least one through substrate contact (TSC) 142 may be formed to penetrate the first substrate 111 to connect with the devices of the array wafer 110 and/or devices of the CMOS wafer 120. Further, an isolating layer 114 may be formed to cover the first substrate and the at least one through substrate contact. The isolating layer 114 may include dielectric materials including silicon oxide, silicon nitride, silicon oxynitride, or any combination thereof. Further, a plurality of array pads 140 may be formed in contact with the least one through substrate contact 142, and the array pads 140 may be used for external input/output terminals.

Accordingly, a 3D memory device and a fabricating method thereof are provided. In some embodiments, the fabricating method may include forming an array wafer including a string and a cell region; forming a CMOS wafer including a page buffer region and a string driver region, wherein page buffers formed in the page buffer region are in a folded structure; bonding the array wafer and the CMOS wafer; and forming a plurality of array pads in contact with at least one through substrate contact penetrating the first substrate.

Although the above 3D memory device may be made with the array wafer and the CMOS wafer, other structures may be used. For example, the CMOS wafer may be a semiconductor structure formed on the array wafer, instead of a separate wafer that is bonded to the array wafer. For another example, the array wafer may be a semiconductor structure formed on the CMOS wafer, instead of a separate wafer that is bonded to the CMOS wafer. Thus, in general, according to the disclosed embodiments, an array structure (e.g., an array wafer or an array layer) and a CMOS structure (e.g., a CMOS wafer or a CMOS layer) may be used to refer the above array wafer and/or COMS wafer, and the array structure and the CMOS structure may be combined to form the 3D memory device.

Figure 7:
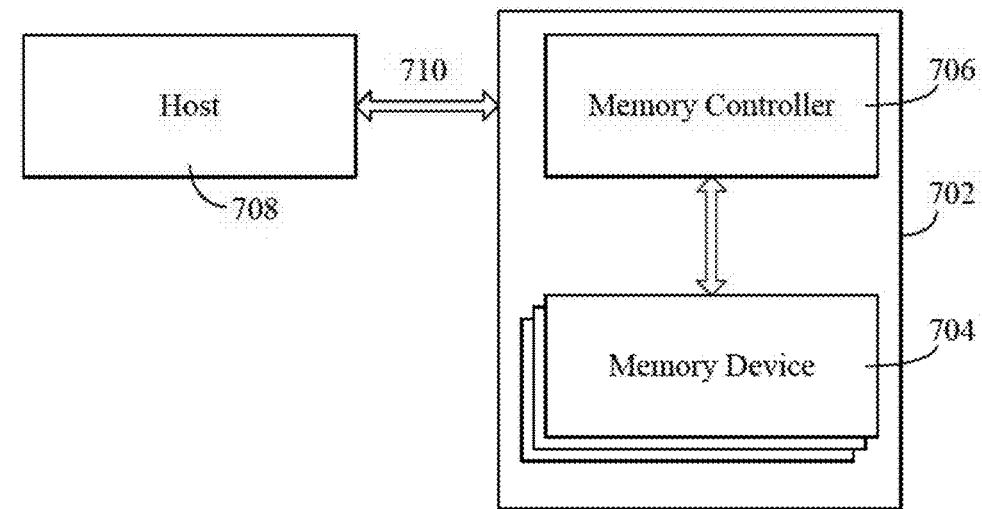
FIG. 7 illustrates a block diagram of an exemplary system having a memory device consistent with various disclosed embodiments in the present disclosure.

FIG. 7 shows a block diagram of an exemplary system 700 having a memory device according to various aspects of the present disclosure. The system 700 may be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 7, the system 700 may include a host 708 and a memory system 702 having one or more memory devices 704 and a memory controller 706. The host 708 may be a processor of an electronic device, such as a central processing unit (CPU), or a system-on-chip (SoC), such as an application processor (AP). The host 708 may be configured to send or receive data to or from the memory devices 704.

The memory controller 706 is coupled to the memory devices 704 and host 708 and is configured to control the memory devices 704, according to some implementations. The memory controller 706 may also be integrated into the memory devices 704. The memory controller 706 may manage the data stored in the memory devices 704 and communicate with the host 708 with an interface 710. In some embodiments, the memory controller 706 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some other embodiments, the memory controller 706 is designed for operating in a high duty-cycle environment, such as solid-state drives (SSDs) or embedded multi-media-cards (eMMCs) used as data storage for mobile devices, such as smartphones, tablets, laptop computers, etc., and enterprise storage arrays. The memory controller 706 may be configured to control operations of the memory device 704, such as read, erase, and program operations.

Figure 8:
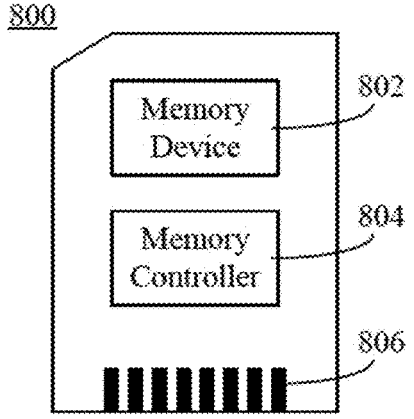
FIG. 8 illustrates a block diagram of an exemplary memory card having a memory device consistent with various disclosed embodiments in the present disclosure.
Figure 9:
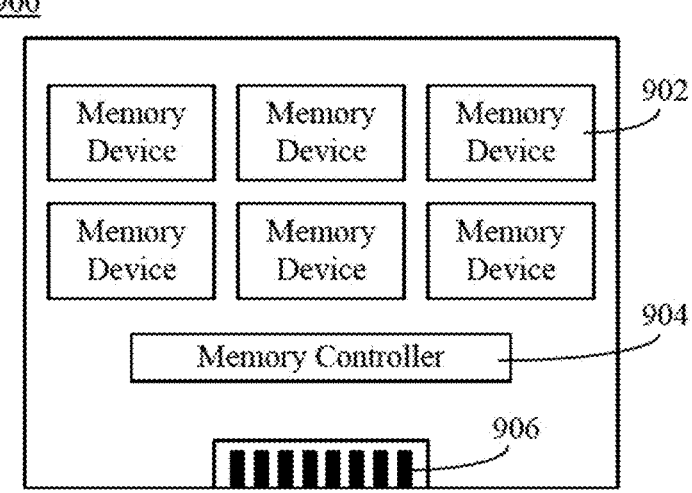
FIG. 9 illustrates a block diagram of an exemplary solid state disk (SSD) having a memory device consistent with various disclosed embodiments in the present disclosure.

The memory device 704 may be any memory device disclosed in the present disclosure. The memory controller 706 and one or more memory devices 704 may be integrated into various types of storage devices, for example, be included in the same package, such as a universal Flash storage (UFS) package or an eMMC package. That is, the memory system 702 may be implemented and packaged into different types of end electronic products. FIGS. 8 and 9 exemplarily illustrate block diagrams of a memory card 800 and an SSD 900 according to various aspects of the present disclosure. As shown in FIG. 8, a memory controller 804 and a single memory device 802 may be integrated into the memory card 800. The memory device 802 may include any memory device disclosed in the present disclosure. The memory card 800 may include a PC card (personal computer memory card international association (PCMCIA)), a CF card, a smart media (SM) card, a memory stick, a multimedia card (MMC, RS-MMC, or MMCmicro), an SD card (SD, miniSD, microSD, or SDHC), a UFS, etc. The memory card 800 may further include a memory card interface or interface connector 806 configured to couple the memory card 800 to a host (e.g., the host 308 shown in FIG. 7). As shown in FIG. 9, a memory controller 904 and multiple memory devices 902 may be integrated into the SSD 900. The memory devices 902 may include any aforementioned memory device disclosed in the present disclosure. The SSD 900 may further include an SSD interface or interface connector 906 configured to couple the SSD 900 to a host (e.g., the host 308 shown in FIG. 7).

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A three-dimensional (3D) memory device, comprising:
   a complementary metal-oxide-semiconductor (CMOS) structure having a page buffer region and a string driver region respectively corresponding to a cell region and a string region in an array structure,
   wherein the CMOS structure further includes a plurality of page buffers in a folded structure formed in the page buffer region; and string driver circuits formed in the string region, wherein
   each page buffer of the plurality of the page buffers includes at least two unfolded portions and at least one folding portion; and
   the plurality of page buffers in the folded structure are aligned at a first device pitch, and the unfolded portions of the page buffers are aligned at a second device pitch, the first device pitch being greater than the second device pitch.

2. The 3D memory device according to claim 1, wherein:
   the 3D memory device further includes the array structure combined with the CMOS structure; and the array structure includes a plurality of memory cells formed in the cell region, and a string structure formed in the string region.

3. The 3D memory device according to claim 2, wherein: the array structure is an array wafer and the CMOS structure is a CMOS wafer;

the array wafer and the CMOS wafer are combined via a bonding interface between an array joint layer of the array wafer and a CMOS joint layer of the CMOS wafer, and the array joint layer of the array wafer to the CMOS joint layer of the CMOS wafer are bonded together and one or more joint structures on the array joint layer of the array wafer and one or more joint structures on the CMOS joint layer of the CMOS wafer are bonded together for electrical connection.

4. The 3D memory device according to claim 3, wherein the 3D memory device further comprises:

an insulating layer formed over the array wafer;

at least one through substrate contact penetrating the array wafer; and one or more array pads in contact with the at least one through substrate contact.

5. The 3D memory device according to claim 1, wherein the array structure has a plurality of bit lines formed in the cell region aligned at a bit line pitch.

6. The 3D memory device according to claim 5, wherein the first device pitch of the page buffers in the folded structure is measured as the bit line pitch multiplied by a first pre-determined number.

7. The 3D memory device according to claim 6, wherein the second device pitch of the unfolded portions of the page buffers is measured as the bit line pitch multiplied by a second pre-determined number; and the first pre-determined number is greater than the second pre-determined number.

8. The 3D memory device according to claim 7, wherein the first pre-determined number is twice of the second pre-determined number.

9. The 3D memory device according to claim 8, wherein the first pre-determined number is 8, and the second pre-determined number is 4.

10. The 3D memory device according to claim 7, wherein each of the plurality of page buffers includes a plurality of devices and wiring channels, the devices are aligned at the second device pitch, and the wiring channels are aligned at the first device pitch.

11. The 3D memory device according to claim 10, wherein the devices include sources, drains, and gates of CMOS transistors, and the at least one folding portion includes shared sources and/or drains.

12. The 3D memory device according to claim 11, wherein the CMOS transistors are fin field-effect transistors having different fin heights.

13. The 3D memory device according to claim 7, wherein: each of the page buffer of the plurality of the page buffers has three unfolded portions and two folding portions; and the first pre-determined number is three times of the second pre-determined number.

14. A memory system, comprising:

a 3D memory device, including a complementary metal-oxide-semiconductor (CMOS) structure having a page buffer region and a string driver region respectively corresponding to a cell region and a string region in an array structure, a plurality of page buffers in a folded structure formed in the page buffer region; and string driver circuits formed in the string region, wherein each page buffer of the plurality of the page buffers includes at least two unfolded portions and at least one folding portion; and the plurality of page buffers in the folded structure are aligned at a first device pitch, and the unfolded portions of the page buffers are aligned at a second device pitch, the first device pitch being greater than the second device pitch;

a memory controller coupled to the 3D memory device for controlling the 3D memory device; and an external interface for communicating with a host for storing information in the 3D memory device.

15. The memory system according to claim 14, wherein: the 3D memory device further includes the array structure combined with the CMOS structure; and the array structure includes a plurality of memory cells formed in the cell region, and a string structure formed in the string region.

16. The memory system according to claim 14, wherein the external interface includes one of universal serial bus (USB), secure digital (SD), compact flash (CF), solid state drive (SSD), and embedded multi-media-card (eMMC).

17. A method for forming a three-dimensional (3D) memory device, comprising:

forming an array wafer having a cell region and a string region, including: providing a first substrate having the cell region and the string region; forming a plurality of memory cells on the first substrate in the cell region; and forming a string structure on the first substrate in the string region;

forming a complementary metal-oxide-semiconductor (CMOS) wafer having a page buffer region and a string driver region respectively corresponding to the cell region and the string region, including: providing a second substrate having the page buffer region and the string driver region; forming a plurality of page buffers in a folded structure in the page buffer region; and forming string driver circuits in the string region, wherein each page buffer of the plurality of the page buffers includes at least two unfolded portions and at least one folding portion; and the plurality of page buffers in the folded structure are aligned at a first device pitch, and the unfolded portions of the page buffers are aligned at a second device pitch, the first device pitch being greater than the second device pitch;

bonding the array wafer and the CMOS wafer at a bonding interface; and forming the 3D memory device based on the bonded array wafer and CMOS wafer.

18. The method according to claim 17, wherein:

forming the array wafer further comprises:

forming a plurality of bit lines in the cell region in connection with the plurality of memory cells, wherein the bit lines are aligned at a bit line pitch; and the first device pitch of the page buffers in the folded structure is measured as the bit line pitch multiplied by a first pre-determined number.

19. The method according to claim 18, wherein the second device pitch of the unfolded portions of the page buffers is measured as the bit line pitch multiplied by a second pre-determined number; and

the first pre-determined number is greater than the second pre-determined number.

20. The method according to claim 19, wherein forming a plurality of page buffers in a folded structure in the page buffer region further comprises:

forming a plurality of devices and wiring channels in each of the plurality of page buffers, wherein the devices are aligned at the second device pitch, and the wiring channels are aligned at the first device pitch.

* * * * *